(12) United States Patent
Kasperkovitz

(10) Patent No.: US 7,535,289 B2
(45) Date of Patent: May 19, 2009

(54) INTEGRATED RC FILTER

(75) Inventor: Wolfdietrich Georg Kasperkovitz, Waalre (NL)

(73) Assignee: Semiconductors Ideas To Market (ITOM) B.V., Breda (NL)

( * ) Notice: Subject to any disclaimer, the term of this patent is extended or adjusted under 35 U.S.C. 154(b) by 818 days.

(21) Appl. No.: 10/487,527

(22) PCT Filed: Aug. 1, 2002

(86) PCT No.: PCT/EP02/08644

§ 371 (c)(1),
(2), (4) Date: Feb. 21, 2004

(87) PCT Pub. No.: WO03/015267

PCT Pub. Date: Feb. 20, 2003

(65) Prior Publication Data

US 2004/0217806 A1 Nov. 4, 2004

(30) Foreign Application Priority Data

Aug. 6, 2001 (EP) ................................. 01203003

(51) Int. Cl.
*H03K 5/00* (2006.01)
(52) U.S. Cl. ...................................... 327/558; 327/552
(58) Field of Classification Search ......... 327/552–559, 327/311, 308; 455/307, 339; 330/258
See application file for complete search history.

(56) References Cited

U.S. PATENT DOCUMENTS

| | | | |
|---|---|---|---|
| 4,163,948 A | | 8/1979 | Singer et al. |
| 4,404,529 A | | 9/1983 | Rossum et al. |
| 4,517,415 A | * | 5/1985 | Laurence .................... 381/317 |
| 4,871,984 A | * | 10/1989 | Laton et al. ............. 331/107 A |
| 5,311,141 A | | 5/1994 | Umeyama et al. |
| 6,002,296 A | | 12/1999 | Kawakami |
| 6,091,289 A | | 7/2000 | Song et al. |
| 6,462,327 B1 | * | 10/2002 | Ezell et al. .............. 250/214 A |
| 6,667,669 B2 | * | 12/2003 | Goyette et al. ............ 333/81 R |
| 6,678,511 B2 | * | 1/2004 | Hwang et al. ................ 455/307 |

FOREIGN PATENT DOCUMENTS

EP 0829959 3/1998

* cited by examiner

*Primary Examiner*—Dinh T. Le
(74) *Attorney, Agent, or Firm*—Robert M. McDermott, Esq.

(57) ABSTRACT

An integrated RC filter comprises a first resistor being coupled to a first capacitor through a first node and a signal input of said integrated RC filter is coupled through one of the first resistor and the first capacitor to the first node. To allow for an increase in the RC time constant of the RC filter without losing signal transparency, amplification means are included between said signal input and said one of the first resistor and the first capacitor having a gain factor substantially larger than unity, said first node being coupled through attenuation means to a signal output, said attenuation means having an attenuation factor substantially.

28 Claims, 4 Drawing Sheets

INTEGRATED RC FILTER

The invention relates to an integrated RC filter comprising a first resistor being coupled to a first capacitor through a first node, a signal input of said integrated RC filter being coupled through one of the first resistor and the first capacitor to the first node.

Such an integrated RC filter is known, e.g. from U.S. Pat. No. 6,091,289. Integrated RC filters are self contained in that both resistor R and capacitor C are monolithically integrated, in contrast to hybrid RC filters which use an on-chip integrated resistor in combination with a discrete capacitor located outside the chip. However, large integrated resistors and large integrated capacitors require large chip area and are sensitive to unwanted parasitic effects, whereas discrete capacitors are much less sensitive to parasitic effects and can be chosen very large at low costs. Compared with said hybrid RC filters, integrated RC filters are limited in the upper bound value of their RC time constant or, put otherwise, in the lower bound value of their cut off frequency, by cost price and/or unwanted parasitic effects. For this reason, hybrid RC filters are often preferred over nowadays monolithically integrated RC filters in particular when large RC time constants are required, despite the costs of logistic and assembling going along with the use discrete capacitors.

Where cost reduction of hybrid RC filters at large RC time constant is obtained by minimizing the integrated resistance value R and maximizing the discrete capacitance value C, cost reduction of integrated RC filters is obtained by minimizing the overall chip area. As in general the chip area of integrated capacitances is significantly larger than that of integrated resistances, the capacitance value C of such integrated RC filters is therefore reduced by maximizing the resistance value R. A further reduction of the actually integrated capacitance value may be obtained by including the capacitor in a negative feedback loop of an amplifier, such as shown in FIG. 6 of the above cited U.S. Patent. The amplifier therewith effectuates a multiplication of the actual value of the integrated capacitance with its gain factor. This results in a minimum use of chip area and therewith minimum cost price, which increases with the RC time constant required.

FIG. 1A is a graphical representation of the cost price of an integrated RC filter using passive integrated resistors and providing an RC time constant of 0,1 msec with a capacitance value C varying within a certain capacitance range using an IC technology providing by way of example 1nF/mm2 and 10 Mohm/mm2 at a chip price of 0.10 US$/mm2. From this representation it can be derived that the minimum cost price of such integrated RC filter is approximately 0.03 US$. In the same technology an integrated RC filter providing an RC time constant of 0,1 sec will have a minimum cost price of approximately 0.65 US$, as is shown in FIG. 1B. This shows how strong the cost price of fully integrated RC filters increases with the RC time constant.

In the above mentioned known integrated RC filter, active integrated resistors are used. Compared with passive integrated resistors, such active integrated resistors may boost the resistance value per mm2 chip area up to 10 Gohm, therewith relaxing the need for chip area. However, integrated resistors suffer from parasitic effects such as noise and spurious signals, due to parasitic capacitances of the integrated circuit elements to substrate, DC level offsets, cross talk via the supply voltage Vcc, due to parasitic capacitance (poor ripple rejection), cross talk via Vsubstrate due to parasitic capacitance (poor isolation), etcetera. These parasitic effects strongly increase with the resistance value R and the more so in active integrated resistors. This limits said known integrated RC filter in the upper bound value of its RC time constant.

Now, therefore, it is an object of the invention to increase the RC time constant of integrated RC filters significantly beyond the limits of the known integrated RC filters, while avoiding the above drawbacks from occurring.

Another object of the invention is to provide an integrated RC filter, which can be used as a compatible standard building block for providing filter selectivity with large RC time constant and low noise and spurious signals.

This object is achieved in an integrated RC filter as described in the opening paragraph according to the invention, which is characterized by amplification means included between said signal input and said one of the first resistor and the first capacitor for an amplification of the input signal having a gain factor for the signal in the pass band region of the RC filter being substantially larger than unity, said first node being coupled through attenuation means to a signal output, said attenuation means having an attenuation factor substantially corresponding to said gain factor.

The invention is based on the recognition that due to the above minimization of chip area of integrated RC filters by increasing the resistance value and decreasing the capacitance value, noise and spurious signals of integrated RC filters are mainly determined by the parasitic effects occurring in the active resistor. By applying the invention the useful input signal of the RC filter is amplified by said amplification means with a relatively large gain factor, before it is affected by the noise and spurious signals generated in the first resistor. This is in contrast to the amplifier of the conventional RC filter known from FIG. 6 of the above citation, which—in effectuating a multiplication of the actual value of the integrated capacitance with its gain factor—does not provide signal amplification.

The actual reduction of the unwanted noise and spurious signals in accordance with the invention is obtained in the attenuation means following said first node. By choosing the attenuation factor of said attenuation means to correspond to the gain factor of the amplifying means, an overall unity gain of the RC filter for the useful signals is obtained along with a reduction of noise and spurious signals being determined by the gain factor of said amplifying means. The RC filter is therewith neutral or transparent with regard to the signal amplitude, allowing for a compatible use as standard building block.

Compared with conventional RC filters having a certain RC timeconstant and a certain level of noise and spurious signals, the RC filter according to the invention provides much less noise and spurious signals at the same RC time constant and/or a much larger RC timeconstant at the same level of noise and spurious signals.

An embodiment of an integrated RC filter according to the invention is characterized by said attenuation means comprising a buffer stage followed by a resistive voltage divider, said buffer stage having an input impedance substantially higher than its output impedance and said resistive voltage divider having an input impedance substantially equal to the output impedance of the buffer stage. This measure allows to use a low resistance voltage divider for the purpose of attenuation without influencing the signal at the first node.

Preferably, such buffer stage is implemented by means of an emitter or source follower transistor stage.

An embodiment of an integrated RC filter according to the invention providing high pass signal selectivity is characterized by said signal input being subsequently coupled through said amplification means and said first capacitor to said first node, said first node being coupled on the one hand through said first resistor to a DC reference voltage and on the other hand through said attenuation means to said signal output.

To optimise the reduction in noise and spurious signals, while maintaining linear signal selection, an embodiment of an integrated RC filter according to the invention providing high pass signal selectivity and using a buffer stage constituted by an n-MOS transistor stage is characterized by said amplification means being arranged to provide an output signal having an average DC output level at substantially half of the supply voltage level, said DC reference voltage being substantially equal to half of the difference between the supply voltage and the threshold voltage of said n-MOS transistor stage.

For the same purpose, an embodiment of an integrated RC filter according to the invention providing high pass signal selectivity and using a buffer stage constituted by an p-MOS transistor stage is characterized by said amplification means being arranged to provide an output signal having an average DC output level at substantially half of the supply voltage level, said DC reference voltage being substantially equal to half of the difference between ground and the threshold voltage of said P-MOS transistor stage.

An embodiment of an integrated RC filter according to the invention providing low pass signal selectivity is characterized by said signal input being subsequently coupled through said amplification means and said first resistor to said first node, said first node being coupled through said first capacitor to a DC reference voltage and through said attenuation means to said signal output.

To optimise the reduction in noise and spurious signals, while maintaining linear signal selection, an embodiment of an integrated RC filter according to the invention providing low pass signal selectivity and using a buffer stage constituted by an n-MOS transistor stage is characterized by said amplification means being arranged to provide an output signal having an average DC output level at substantially half of the difference between the supply voltage and the threshold voltage of said n-MOS transistor stage.

To optimise the reduction in noise and spurious signals, while maintaining linear signal selection, an embodiment of an integrated RC filter according to the invention providing low pass signal selectivity and using a buffer stage constituted by an p-MOS transistor stage is characterized by said amplification means being arranged to provide an output signal having an average DC output level at substantially half of the difference between ground and the threshold voltage of said p-MOS transistor stage.

An embodiment of an integrated RC filter according to the invention combining low frequency range signals with high frequency range signals is characterized by said signal input comprising low pass and high pass signal inputs, said amplification means comprising first and second amplifiers, respectively coupled between said low pass and high pass signal inputs on the one hand and said first resistor and said first capacitor on the other hand. In both low pass and high pass modes of operation, the RC filter provides the same RC time constant.

An embodiment of a high pass integrated RC filter according to the invention is characterized by said signal input being coupled through subsequently a signal subtracting device, said amplification means and said first resistor to said first node, said first node being coupled on the one hand through said first capacitor to a DC reference voltage and on the other hand through said attenuation means to said signal output means, and by a negative DC feedback loop from an output of the attenuation means to an input of the signal subtracting device. In this embodiment, the integrated RC filter operates in a high pass mode and provides a large RC time constant with small DC offset and low noise and low spurious signals and can be integrated within a relatively small chip area.

A balanced embodiment of the integrated RC filter with differential signal processing according to the invention with high pass signal selectivity is characterized by the signal input thereof comprising a differential pair of input terminals and said signal output thereof comprising a differential pair of output terminals, said amplification means being constituted by a differential amplifier having a differential amplifier input constituting said differential pair of input terminals and said attenuation means being constituted by a differential attenuator having a differential output constituting the differential pair of output terminals of the integrated RC filter, said differential amplifier having a differential amplifier output, a first amplifier output terminal thereof being coupled through said first capacitor to said first node, a second amplifier output terminal thereof being coupled through a second capacitor to a second node, said first and second nodes being coupled on the one hand through said first and a second resistor, respectively, to said DC reference voltage, and on the other hand to first and second terminals of a differential input of said attenuation means. This embodiment of the integrated RC filter according to the invention provides balanced signal processing resulting in additionally suppressed spurious signals, reduced crosstalk from the supply voltage Vcc to substrate or ground. Furthermore, the balanced circuitry structure allows to easily match the first resistor and first capacitor to the second resistor and second capacitor, respectively.

A balanced embodiment of the integrated RC filter with differential signal processing according to the invention with low pass signal selectivity is characterized by the signal input thereof comprising a differential pair of input terminals and said signal output thereof comprising a differential pair of output terminals, said amplification means being constituted by a differential amplifier having a differential amplifier input constituting said differential pair of input terminals, said attenuation means being constituted by a differential attenuator having a differential output constituting the differential pair of output terminals of the integrated RC filter, said differential amplifier having a differential amplifier output, a first amplifier output terminal thereof being coupled through said first resistor to said first node, a second amplifier output terminal thereof being coupled through a second resistor to a second node, said first and second nodes being respectively coupled to first and second terminals of a differential input of said differential attenuator and mutually coupled through a further capacitor having a capacitance value of half the capacitance value of said first capacitor. The balanced circuitry structure and signal processing in this embodiment of the integrated RC filter according to the invention result in additionally suppressed spurious signals and reduced crosstalk from the supply voltage Vcc to substrate or ground. Furthermore, the balanced circuitry structure allows to easily match the first resistor and first capacitor to the second resistor and second capacitor, respectively, whereas the capacitance value of the capacitor can be one quarter of the capacitance value needed for a duplicate use of an unbalanced, single sided low pass embodiment of the RC filter.

A balanced embodiment of the integrated RC filter with differential signal processing according to the invention is characterized by said amplification means comprising first and second transconductance amplifiers having mutually crossconnected differential inputs coupled to a differential pair of input terminals of said signal input means, each having a single current output, the single current outputs of the first and second single transconductance amplifiers providing mutually phase opposite output signals to said first and second resistors respectively and being coupled to outputs of first and second mutually identical DC voltage dividers. The DC output voltage levels of said first and second DC voltage dividers are chosen to obtain maximum gain by the full use of the active output signal range.

A balanced embodiment of the integrated RC filter with differential signal processing according to the invention is characterized by said attenuation means comprising said first and a second buffer stage each having an input constituting respectively said first and second input terminals of the differential input of said attenuation means, each comprising an emitter or source follower transistor stage, said first and second buffer stages having first and second output terminals being mutually coupled through a serial arrangement of first to third resistance means, said first resistance means being identical to said third resistance means, first and second terminals of the differential output of said attenuation means being coupled across the second resistance means. In this embodiment the first and second buffer stages prevent the input resistance of the resistive voltage divider, which is provided by said first to third resistance means, from deteriorating the signal voltage at the first and second nodes, while allowing to use small resistance values for the first to third resistance means, therewith keeping the level of noise and spurious signals generated in this resistive voltage divider at relatively low value.

A balanced embodiment of the integrated RC filter with differential signal processing according to the invention is characterized by said attenuation means comprising said first and a second buffer stage each having an input constituting respectively said first and second input terminals of the differential input of said attenuation means, each comprising an emitter or source follower transistor stage, said first and second buffer stages having first and second output terminals being coupled to a pair of input terminals of a differential stage, outputs thereof being mutually coupled through a serial arrangement of two mutually equal resistors, the common node of said resistors being supplied with a DC reference voltage corresponding to the average DC level of the input signal of the RC filter. The differential stage together with said serial arrangement of two mutually equal resistors, provides a DC level shift allowing to compensate for the DC level shift occurring in the amplifying means, therewith obtaining DC level transparency form signal input to signal output of the RC filter.

A balanced embodiment of the integrated RC filter with differential signal processing according to the invention is characterized by said first and second transconductance amplifiers each having a differential amplifier stage for converting a differential pair of input voltages to a differential pair of output currents, said differential pair of output currents being supplied to first and second current mirrors, the output current of the first current mirror being supplied to an input of a third current mirror and output currents of said second and third current mirrors being supplied to an output of said each transconductance amplifier.

Preferably for low noise and spurious signals contribution in said embodiment the output currents of said first and second current mirrors are set at a value, smaller than the output currents of the differential amplifier stage.

A balanced embodiment of the integrated RC filter with differential signal processing according to the invention is characterized by said differential amplifier stage comprising a differential pair of transistors, collectors thereof carrying said differential pair of output currents, said first and second current mirrors each comprising a multiple number of diode connected bipolar input transistors having emitters being coupled through mutually corresponding emitter resistances to said bias voltage, bases and collectors being jointly connected to the respective collectors of said differential pair of bipolar transistors, as well as each comprising a bipolar output transistor, an emitter thereof being coupled to said bias voltage through an emitter resistance substantially equal to the emitter resistances of each of said multiple number of diode connected bipolar input transistors, a base thereof being coupled to the bases of said n diode connected bipolar input transistors and a collector thereof providing said output signal. The use of bipolar transistors results in low 1/f noise and allows for the use of a relatively low supply voltage. Furthermore, emitter resistances provides a negative feedback resulting in a low level noise and spurious signals, low DC offset and high output impedance (high Early voltage).

The third current mirror in the latter embodiment is preferably characterized by the third current mirror comprising first and second transistors having mutually coupled base electrodes and emitter electrodes massconnected via respectively first and second emitter resistors, said first transistor being provided with the output current of the first current mirror, said second transistor providing a collector output current of said third current mirror being substantially equal to said output current of the first current mirror, a third transistor having a collector electrode coupled to a bias voltage and base and emitter electrodes respectively coupled to the collector and base electrodes of the first transistor. In this embodiment the loss in base current in said first transistor is being compensated by said third transistor, therewith making the operation of the third current mirror more accurate.

A further increase in the resistance value of the active resistor of the RC filter is obtained by a fourth transistor being cascode connected to the second transistor having its base coupled to the base of the third transistor, and its collector and emitter respectively coupled to said bias voltage and the collector of the second transistor.

These and further aspects and advantages of the invention will be discussed more in detail hereinafter with reference to the disclosure of preferred embodiments, and in particular with reference to the appended Figures, wherein.

In the Figures, identical parts are provided with the same reference numbers.

Figure 2:
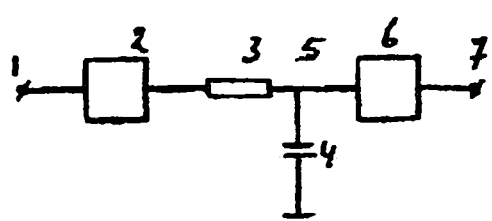
FIG. 2 shows an embodiment of an integrated low pass RC filter according to the invention.

FIG. 2 shows an embodiment of an integrated low pass RC filter according to the invention comprising a signal input 1 subsequently followed by amplification means 2 and a first resistor 3 being coupled to a first node 5, said first node 5 being coupled through a first capacitor 4 to a DC reference voltage, e.g. ground, and through attenuation means 6 to a signal output 7. The amplification means 2 amplifies the input signal Vin of the RC filter with a gain factor, e.g. G, into a signal G*Vin, before it is affected by the noise and spurious signals generated in the first resistor 3, hereinafter in the aggregate being shortly referred to as noise N. This likewise increases the signal to noise ratio S/N of the filtered signal at the first node 5, hereinafter also being referred to as first node signal V5 to G*S/N. The attenuation means 6 following the first node 5 attenuates both the useful signal G*Vin and noise N of the first node signal V5 with an attenuation actor substantially corresponding to said gain factor G. For input signals Vin within the low frequency passband range of the RC filter, both amplification means 2 and attenuation means 6 provide unity gain, whereas noise introduced by the first resistor 3 across the whole active frequency range of the RC filter, is being reduced with the attenuation factor of the attenuation means 6 to 1/G*N. For an effective reduction of said noise N, the gain and attenuation factor G of the amplification means 2 and the attenuation means 6 are chosen substantially larger than unity and preferably at maximum value.

In providing unity gain, the RC filter according to the invention is transparent for input signals Vin within the low frequency passband range. Input signals Vin beyond said low frequency passband range are being attenuated by the selectivity of the RC filter, the same way as in conventional RC filters not using the above combination of amplification and attenuation means. This allows to use the integrated RC filter according to one aspect of the invention as low pass selective building block compatible with conventional integrated low pass RC filters, while offering better signal to noise performance.

According to another aspect of the invention, the above noise reduction may also be used to increase the RC timeconstant τ within given performance specifications with respect to the level of noise and spurious signals N and/or to reduce chip area and therewith the costprice. As known, the RC timeconstant τ of the RC filter is determined by R*C, in which R represents the resistance value of the first resistor 3 and C the capacitance value of the first capacitor 4. Taken into account that the chip area of integrated active resistors is much smaller than the chip area of integrated capacitors, the RC timeconstant τ is maximized by choosing the resistance value R as large as possible within the limits set by said given performance specifications with a view to minimize the capacitance value C and therewith the overall chip area needed. In reducing the level of noise and spurious signals N, the invention provides room for a further increase of the so maximised resistance value R without exceeding said given performance specifications. Grosso modo, said level of noise and spurious signals N increase with the square root value of the resistance value R of the first resistor. With a gain factor G of the amplification means, said resistance value R can be increased with a factor √G, without changing the noise and spurious signals level. When leaving the capacitance value C of the first capacitor unchanged, such increase of the resistance value R results in a likewise increase of the time constant τ of the RC filter. Instead of increasing the time constant τ of the RC filter, said further increase of the resistance value R may alternatively be used to further reduce the capacitance value C and therewith the costprice.

Figure 3:
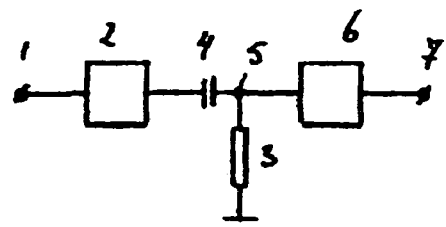
FIG. 3 shows an embodiment of an integrated high pass RC filter according to the invention.

FIG. 3 shows an embodiment of an integrated high pass RC filter according to the invention having the signal input 1 subsequently coupled through the amplification means 2 and the first capacitor 4 to the first node 5, said first node 5 being coupled on the one hand through the first resistor 3 to a DC reference voltage, e.g. ground, and on the other hand through the attenuation means 6 to the signal output 7. The various aspects of the invention as described above in relation with the low pass filter mode of FIG. 2 apply to the high pass mode of the RC filter of this FIG. 3 as well, except for the filtering function. For the reasons mentioned above with respect to signal transparency and the attenuation of noise and spurious signals generated in the first resistor 3, this high pass RC filter according to the invention is compatible with conventional integrated high pass RC filters and may be used as high pass selective building block, while offering better signal to noise performance.

Figure 4:
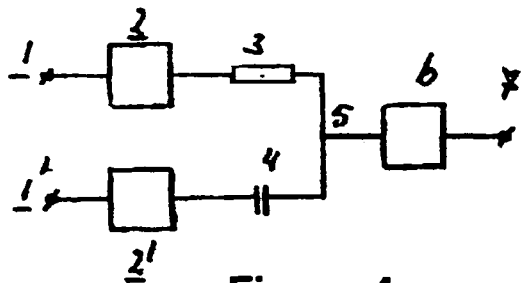
FIG. 4 shows an embodiment of a combined low pass and high pass integrated RC filter according to the invention.

FIG. 4 shows an embodiment of an integrated RC filter according to the invention combining both low pass and high pass filtering modes of the integrated RC filters of FIGS. 2 and 3, the signal input thereof comprising low pass and high pass signal inputs 1 and 1' respectively, said amplification means comprising first and second amplifiers 2 and 2, respectively coupled between said low pass and high pass signal inputs 1 and 1' on the one hand and said first resistor 3 and said first capacitor 4 on the other hand. This embodiment can be used as signal combiner for combining a low frequency range signal being supplied to the low pass signal input 1 with a high frequency range signal being supplied to high pass signal input 1', both signals having the same cut off frequency, or RC time constant τ. Apart from the filtering function, also here the various aspects of the invention as described above in relation with the low pass filter mode of FIG. 2 apply. For the reasons mentioned above with respect to signal transparency and the attenuation of noise and spurious signals generated in the first resistor 3, this low pass and high pass signal combining RC filter according to the invention is compatible with conventional integrated low pass and high pass signal combining RC filters and may be used as selective signal combining building block, while offering better signal to noise performance.

Figure 1A:
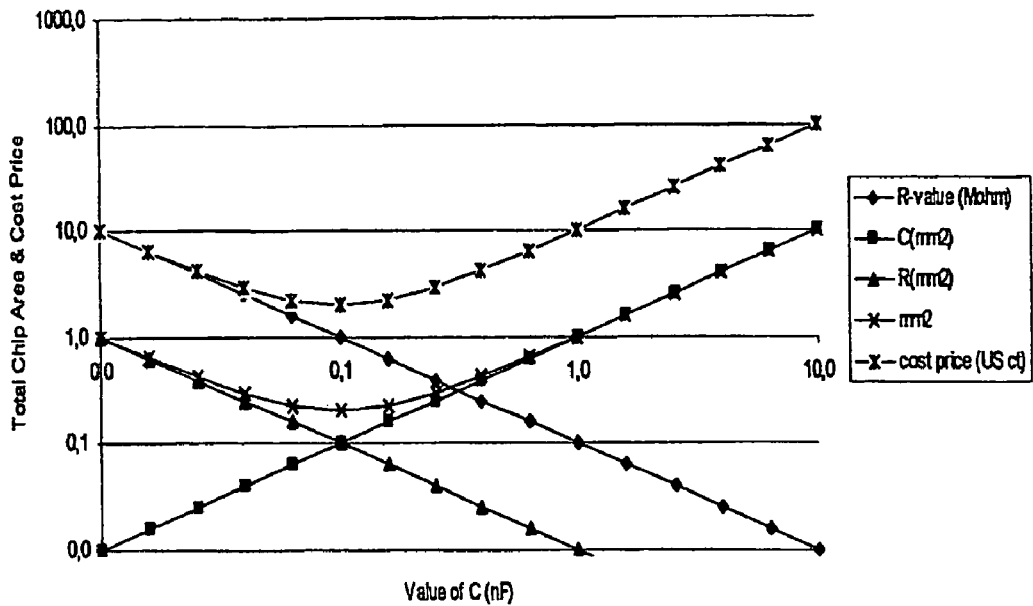
FIGS. 1A and 1B are signal plots showing the cost price of an integrated RC filter using passive integrated resistors as a function of the RC time constant of a conventional integrated RC filter using passive resistances.
Figure 1B:
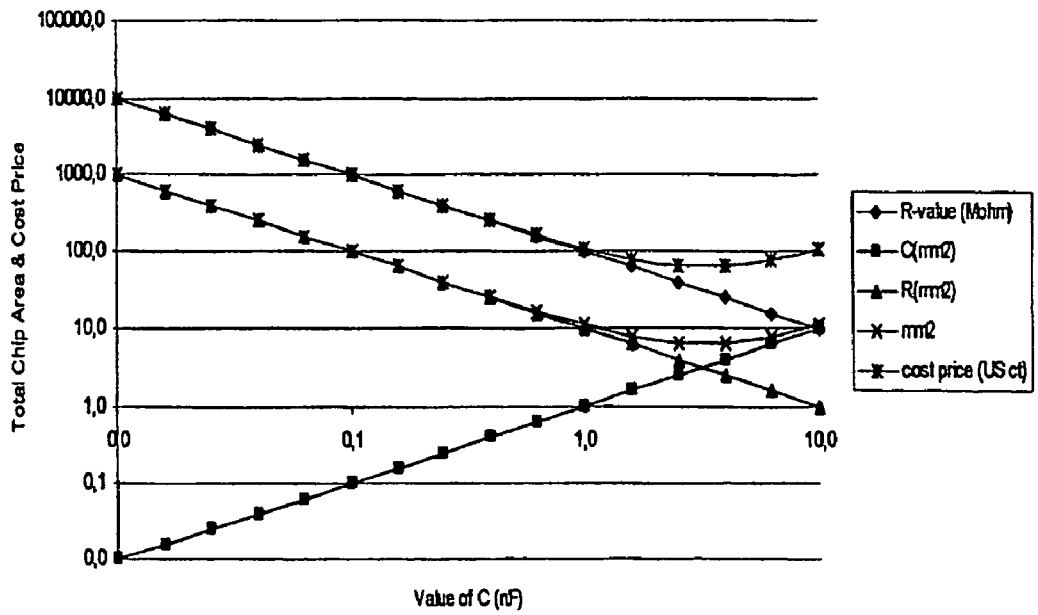
Figure 5:
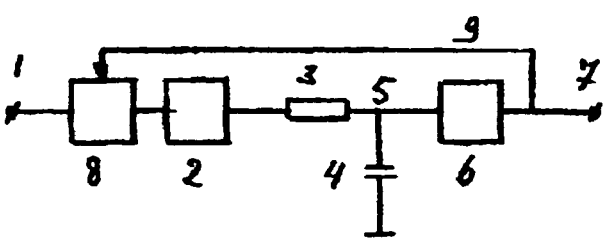
FIG. 5 shows an embodiment of an integrated high pass RC filter according to the invention.

FIG. 5 shows an embodiment of an integrated high pass RC filter according to the invention having its signal input 1 coupled through subsequently a signal subtracting device 8, said amplification means 2 and said first resistor 3 to said first node 5, said first node 5 being coupled on the one hand through said first capacitor 4 to a DC reference voltage, e.g. ground, and on the other hand through said attenuation means 6 to said signal output means 7, and by a negative DC feedback loop 9 from an output of the attenuation means 6 to an input of the signal subtracting device 8. The embodiment shown is based on the low pass RC filter of FIG. 1, in which the output DC level is subtracted in the signal subtracting device 8 from the input signal Vin prior to the amplification thereof in the amplification means 2. The negative DC feed back reduces any DC offset between the input signal Vin and the output signal Vout of the RC filter. As to the signal transparency and the attenuation of noise and spurious signals generated in the first resistor 3, this high pass RC filter according to the invention is compatible with conventional integrated high pass RC filters and may be used as high pass selective building block, while offering better signal to noise performance.

Figure 6:
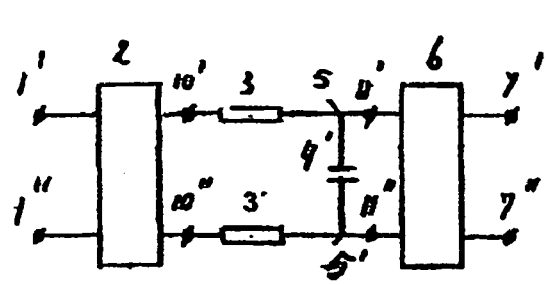
FIG. 6 shows an embodiment of an integrated differential low pass RC filter according to the invention.

A balanced embodiment of an integrated low pass RC filter according to the invention providing differential signal processing is shown in FIG. 6. This balanced embodiment can be seen as a duplicate use of the single sided low pass RC filter of FIG. 2 For a description of the corresponding features, parts and structure reference is made to the above description of FIG. 2.

The signal input 1 of the integrated differential low pass RC filter of FIG. 6 comprises a differential pair of input terminals 1' and 1" and the signal output 7 thereof comprises a differential pair of output terminals 7' and 7". The amplification means 2 is constituted by a differential amplifier having a differential amplifier input constituting said differential pair of input terminals 1' and 1" and said attenuation means 6 being constituted by a differential attenuator having a differential output constituting the differential pair of output terminals 7' and 7" of the integrated RC filter, said differential amplifier having a differential amplifier output, a first amplifier output terminal 10' thereof being coupled through said first resistor 3 to said first node 5, a second amplifier output terminal 10" thereof being coupled through a second resistor 3' to a second node 5', said first and second nodes 5 and 5 being respectively coupled to first and second terminals of a differential input of said differential attenuator and mutually coupled through a further capacitor 4' having a capacitance value of half the capacitance value of said first capacitor 4.

Figure 7:
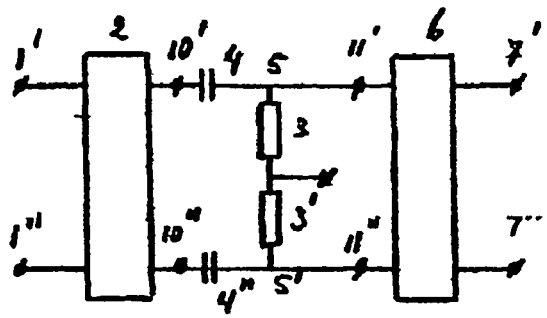
FIG. 7 shows an embodiment of an integrated differential high pass RC filter according to the invention based on a low pass mode with feed back.

In addition to the advantages of the invention obtained with the RC filter of FIG. 2, a further suppression of spurious signals is obtained by a balanced matching between the first and second resistors 3 and 3' and by combining the two capacitors of such two single sided low pass RC filters. Compared with a duplicate use of two single sided low pass RC filters, the balanced combination of said two capacitors results in a reduction of the capacitance value by 4, therewith allowing to increase the RC time constant and/or to decrease the costprice. Furthermore, the differential signal processing in this integrated balanced low pass RC filter according to the invention results in reduced crosstalk via the supply voltage Vcc and substrate or ground A balanced embodiment of the integrated high pass RC filter according to the invention providing differential signal processing is shown in FIG. 7. This balanced embodiment can be seen as a duplicate use of the single sided high pass RC filter of FIG. 3. For a description of the corresponding features, parts and structure reference is made to the above description of FIG. 3.

The signal input 1 of the integrated differential high pass RC filter of FIG. 7 comprises a differential pair of input terminals 1' and 1" and the signal output 7 thereof comprises a differential pair of output terminals 7' and 7". The amplification means 2 is constituted by a differential amplifier having a differential amplifier input constituting said differential pair of input terminals 1' and 1" and said attenuation means 6 being constituted by a differential attenuator having a differential output constituting the differential pair of output terminals 7' and 7" of the integrated RC filter, said differential amplifier having a differential amplifier output, a first amplifier output terminal 10' thereof being coupled through said first capacitor 4 to said first node 5, a second amplifier output terminal 10" thereof being coupled through a second capacitor 4" to a second node 5', said first and second nodes 5 and 5' being coupled on the one hand through said first and a second resistor 3 and 3', respectively, to a DC reference voltage substantially equal to 0.5 Vcc, and on the other hand to first and second terminals 11' and 11" of a differential input of said attenuation means 6.

In addition to the advantages of said single sided high pass RC filter, a further suppression of spurious signals is obtained by a balanced matching between the first and second resistors 3 and 3' and between the first and the second capacitors 4 and 4". The differential signal processing in this integrated balanced high pass RC filter according to the invention results in reduced crosstalk via the supply voltage Vcc and substrate or ground.

Figure 8:
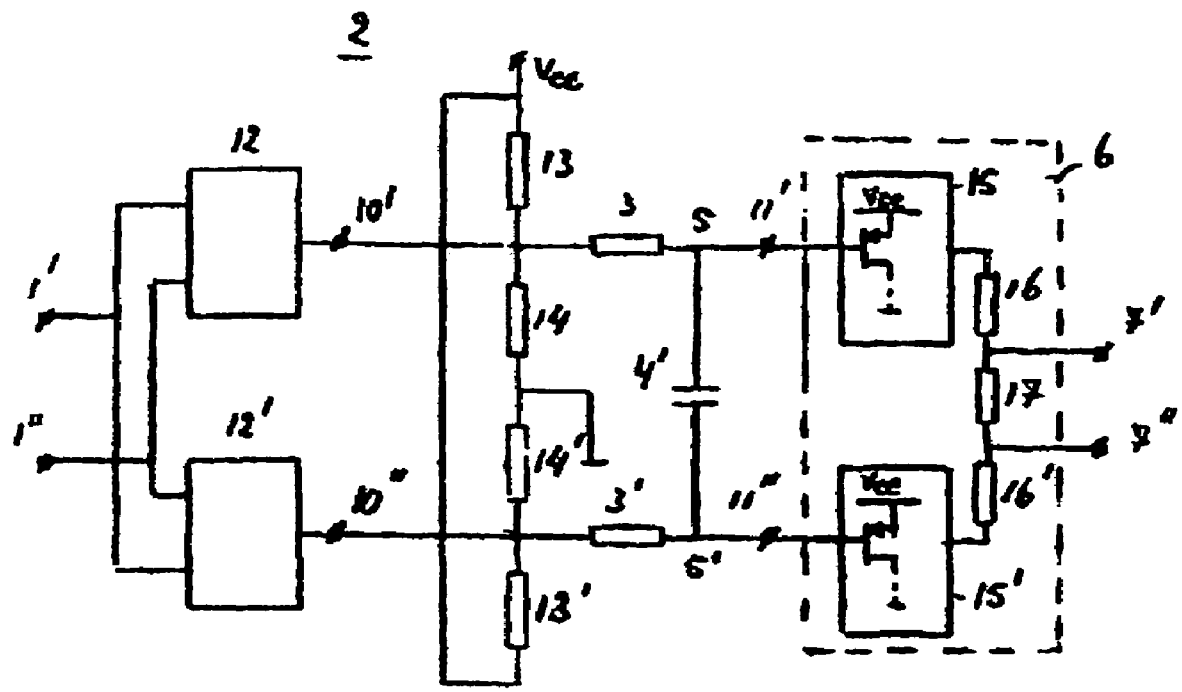
FIG. 8 shows an embodiment of an integrated differential low pass RC filter according to the invention with DC level setting of the output signal of the amplification means for maximum usable output voltage swing and maximum built-in output resistance R.

FIG. 8 shows a preferred embodiment of an integrated differential low pass RC filter according to the invention based on the concept of the integrated differential low pass RC filter of FIG. 6 with DC level setting of the output signal of the amplification means 2 for maximum usable output voltage swing and maximum built-in output resistance Rout. For a description of the corresponding features, parts and structure reference is made to the above description of FIG. 6.

In this preferred embodiment the amplification means 2 comprises first and second transconductance amplifiers 12 and 12' having mutually crossconnected differential inputs coupled to the differential pair of input terminals 1' and 1" of the signal input 1 of the RC filter. The transconductance amplifiers 12 and 12' are each single ended, i.e. are each provided with a single current output, respectively constituting the above first and second amplifier output terminals 10' and 10". The first amplifier output terminal 10' is coupled through the first resistor 3 to the first node 5, the second amplifier output terminal 10" through the second resistor 3' to the second node 5'. The single current outputs of the first and second transconductance amplifiers 12 and 12' are coupled to outputs of first and second mutually identical resistive DC voltage dividers 13, 14 and 13', 14' and provide mutually phase opposite output signals to the first and second resistors 3 and 3', respectively. The first DC voltage divider 13, 14 includes a serial arrangement of resistors 13 and 14 coupled between the supply voltage Vcc and ground, the common node thereof being coupled to the current output of the first transconductance amplifier 12, i.e. the amplifier output terminal 10'. The second DC voltage divider 13', 14' includes a serial arrangement of resistors 13' and 14' coupled between the supply voltage Vcc and ground, the common node thereof being coupled to the current output of the second transconductance amplifier 12', i.e. the amplifier output terminal 10". The resistors 13, 14 correspond respectively to the resistors 13', 14'.

The differential attenuation means 6 comprises first and second buffer stages 15 and 15' each having an input terminal constituting respectively said first and second input terminals 11' and 11" and having an output terminal being mutually coupled through a resistive voltage divider 16, 17 and 16' for an attenuation of the output signals of the RC filters. Such buffer stages are on itself known and may e.g. correspond to the buffer N38 in FIG. 3 of the above cited U.S. Pat. No. 6,091,289. The resistive voltage divider 16, 17 and 16' is therefore constituted by a serial arrangement of first to third resistors 16, 17 and 16, said first resistance means 16 being identical to said third resistance means 16', the first and second terminals 7 and 7 of the differential output of said attenuation means 6 being coupled across the second resistor 17.

The first and second buffer stages 15 and 15' each comprises a source follower transistor stage and providing unity gain The source follower of the first and second buffer stages 15 and 15' provides these stages with a high input impedance and a low output impedance. The buffer stages 15 and 15' are therewith prevented from affecting the signal voltages at the first and second nodes 5 and 5'. The low output impedance of the buffer stages 15 and 15' allow for the use of a resistive voltage divider having a low overall resistance, therewith keeping the level of noise and spurious signals generated therein at a low value.

To optimise the reduction in noise and spurious signals in accordance with the invention, while maintaining linear signal selection, the amplification means 2 is to be optimized in gain, while preventing the differential signal between the first and second nodes 5 and 5', i.e. the input signals of the first and second buffer stages 15 and 15', from exceeding beyond the linear input range of these buffer stages. For an optimization of the gain of the amplification means 2, the differential input signal of the RC filter is supplied to the first and second transconductance amplifiers 12 and 12' through their mutually crossconnected differential inputs in mutually opposite phase, whereas the differential output signal occurring between the single current outputs of these transconductance amplifiers 12 and 12' is to be set at an average DC level substantially at half the supply voltage Vcc to obtain maximum usable output voltage swing. However, to prevent the node signals V5 and V5', from exceeding beyond the linear input range of the buffer stages 15 and 15', which would result in non-linear signal processing or clipping, a correction of said average DC level, dependent on the input threshold voltage Vth of the buffer stages, is to be made. If the source follower stage of the buffer stages 15 and 15 is a p-MOS type transistor stage, then an appropriate average DC level of the differential output signal provided by between the outputs of the transconductance amplifiers 12 and 12' at which the above optimization is obtained, is defined by 0.5*(Vcc-Vth). If the source follower stage of the buffer stages 15 and 15 is an n-MOS type transistor stage, then an appropriate average DC level at which the above optimization is obtained, is defined by 0.5*(Vth-Vground). It will be clear, that for supply voltages Vcc, which are relatively high with respect to said input threshold voltage Vth of the buffer stages 15 and 15, the average DC level of the differential output signal of the amplifying means 2 may be chosen substantially equal to 0.5*Vcc. Such P-MOS and n-MOS source follower transistor stages are on themselves known, reason for which further description and illustration is being omitted.

Preferably, the resistance values of the first and second resistors 3 and 3' are being included in the output impedance of the amplifying means 2, which eliminates the need for value and therewith the timeconstant τ of the RC filter. To maximize said output impedance, the output stages of the transconductance amplifiers 12 and 12' are being separate resistors therewith lowering the costprice and/or allows to further increase the filter resistance provided with bipolar transistors with emitter feed back. This will hereinafter be discussed in more detail with reference to FIG. 10.

The above features of the invention in the preferred embodiment of this FIG. 8 apply mutatis mutandis to the concept of the integrated differential high RC filter of FIG. 7 as well. In view of the dual analogy between the low pass and high pass mode of the RC filter according to the invention, further description thereof is omitted.

Figure 9:
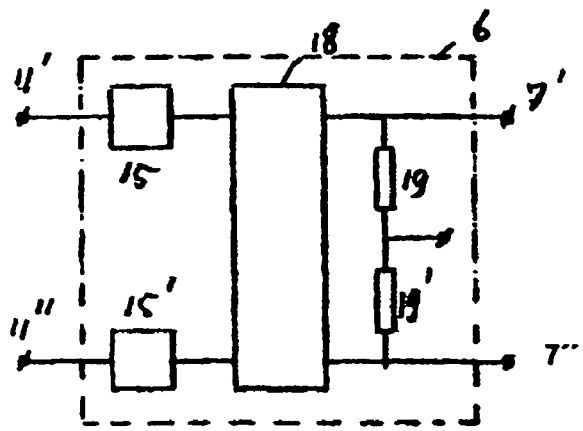
FIG. 9 shows an alternative embodiment of the attenuation means for use in an integrated RC filter according to the invention.

FIG. 9 shows an alternative embodiment of the attenuation means 6 for use in an integrated RC filter according to the invention comprising first and second buffer stages 15 and 15' each having an input constituting respectively said first and second input terminals 11' and 11" of the attenuation means 6, said first and a second buffer stage, each comprising an emitter or source follower transistor stage, said first and second buffer stages 15 and 15' having first and second output terminals being coupled to a pair of input terminals of a differential stage 18, outputs thereof being mutually coupled through a serial arrangement of two mutually equal resistors 19 and 19', the common node of said resistors being supplied with a DC reference voltage. The first and second buffer stages 15 and 15' provide the attenuation means 6 with a high differential input impedance, while allowing to use low resistance values for the resistors 19 and 19'. To obtain DC transparency from input to output of the RC filter, said DC reference voltage is chosen to correspond to the average DC level of the input signal of the RC filter.

The differential stage 18 is constituted by a bipolar differential transistor stage with large emitter resistances, providing voltage to current conversion and a voltage attenuation factor defined by 2*R1/Re, in which R1 represents the resistance value of each of said two resistors 19 and 19' and Re the value of said emitter resistance. The differential stage 18 as such will be explained in more detail with reference to FIG. 10.

Figure 10:
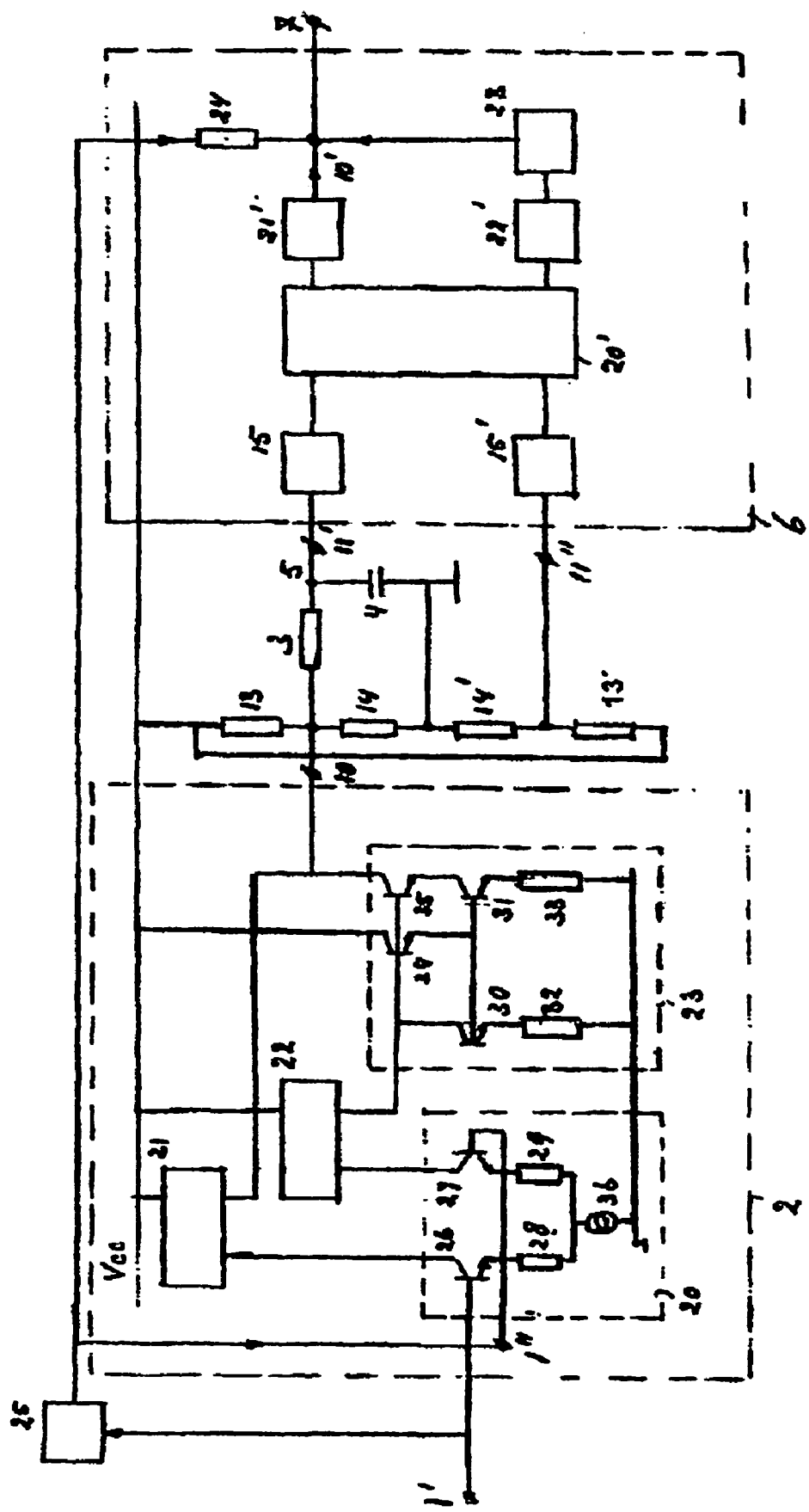
FIG. 10 shows an embodiment of an integrated single sided low pass integrated RC filter according to the invention with DC level setting of the output signal of the amplification means for maximum usable output voltage swing and maximum built-in output resistance R and with DC transparency from signal input to signal output.

FIG. 10 shows an embodiment of an integrated single sided low pass RC filter according to the invention based on the concept of the low pass integrated RC filter of FIG. 2, being provided with DC level setting of the output signal of the amplification means 2 for maximum usable output voltage swing and maximum built-in output resistance and with DC transparency from signal input to signal output. For a description of the corresponding features, parts and structure reference is made to the above description of FIG. 2.

The amplification means 2 comprises a single transconductance amplifier 20-23, an output terminal 10 thereof being coupled through the first resistor 3 to the first node 5 and to the output of the first resistive DC voltage divider 13, 14 being constituted by a serial arrangement of resistors 13 and 14 coupled between the supply voltage Vcc and ground. The first node 5 is coupled on the one hand through the first capacitor 4 to ground and on the other hand to a signal input terminal 11' of the attenuation means 6. The second resistive DC voltage divider 13', 14', being equal to the first one and also coupled between the supply voltage Vcc and ground, provides a DC output level at the common node between the resistors 13' and 14', which is supplied as DC reference level to a reference input 11" of the attenuation means 6. The attenuation means 6 includes the above first and second buffer stages 15 and 15', being respectively supplied via the signal input terminal 11' with the first node signal V5 and via the above reference input 11" of the attenuation means 6 with said DC reference level. Outputs of the first and second buffer stages 15 and 15' are coupled to a signal input and a reference input of a transconductance amplifier 20'-23', which corresponds with the transconductance amplifier 20-23 of the amplification means 2. The ratio between the resistance values of the resistors 13 and 14 of the first resistive DC voltage divider 13, 14 is chosen at a proper value to obtain maximum usable output voltage swing at the output 10 of the amplification means 2 and to prevent non-linear signal processing in the first and second buffer stages 15 and 15' from occurring.

To provide DC transparency from the input 1' to the output 7, the RC filter also includes a signal averaging device 25 deriving the average DC level of the input signal and supplying the same to a reference input 1" of the transconductance amplifier 20-23 and through a resistor 24 to the output of the transconductance amplifier 20'-23' as well.

The mutually corresponding transconductance amplifiers 20-23 and 20'-23' are respectively provided with a differential amplifier 20 and 20' for a conversion from a single sided input voltage signal into a differential pair of output signal currents, said differential pair of output currents being supplied to inputs of first and second current mirrors 21, 22 and 21', 22', the output current of the first current mirror 21, 21' being supplied to an input of a third current mirror 23, 23'. Output currents of said second 22, 22' and third current mirrors 23, 23' are supplied to an output 10, 10 of the transconductance amplifier 20-23 and 20'-23'.

In the following a more detailed description of the transconductance amplifier 20-23 is given, which applies mutates mutandis to the transconductance amplifier 20'-23' as well. The differential amplifier 20 comprises a differential pair of bipolar transistors 26, 27, base inputs being coupled to respectively the signal input 1' and the reference input 1", emitters being coupled through respective emitter resistors 28 and 29 to a common grounded emitter current source 36, collectors thereof providing the above differential pair of output signal currents. The value of the emitter resistors 28 and 29 is chosen to maximize the voltage to current conversion of the differential amplifier 20.

The differential pair of output signal currents is reduced in the first and second current mirrors 21 and 22, which are arranged to provide output currents being a factor n times smaller than their input currents, i.e. the output currents of the differential amplifier stage 2, as will be explained hereinafter with reference to FIG. 11. This allows increase the current set level of the differential pair of bipolar transistors 26, 27, therewith lowering the impedance level and reducing the noise contribution thereof.

The third current mirror 23 comprises first and second transistors 30 and 31 having emitter electrodes connected to ground via respectively first and second emitter resistors 32 and 33 and mutually coupled base electrodes. Said first transistor 30 operates as input transistor receiving through its collector the output current of the first current mirror 21. The second transistor 31 operates as output transistor providing a collector current equal to the collector current of the first transistor 30, i.e. the output current of the first current mirror 21. To compensate for loss of base current in the first transistor 30, which would affect the equality between the input and output current of this third current mirror 23, a third transistor 34 having its base and emitter respectively coupled to the collector and base electrodes of the first transistor 30 and its collector coupled to the supply voltage Vcc.

To increase the output impedance of this third current mirror 23, i.e. the output impedance of the amplification means 2, a fourth transistor 35 is cascode connected to the second transistor 31 having its base coupled to the base of the third transistor 34, and its collector and emitter respectively coupled to the supply voltage and the collector of the second transistor 31. This allows to use the output impedance the amplification means 2 as part or complete substitute for said first resistor 3.

The attenuation factor of the attenuation means 6 is defined by the quotient of the resistance values of the resistor 24 and the emitter resistors of the differential amplifier stage 20'.

Figure 11:
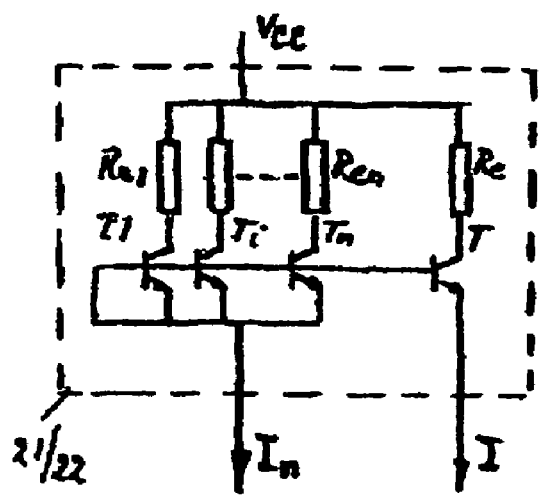
FIG. 11 shows an embodiment of a current mirror for use at the outputs of a differential input amplifier stage of a transconductance amplifier being included in the amplification means of an integrated RC filter according to the invention.

FIG. 11 shows an embodiment of a current mirror for use as the above first and second current mirrors 21 and 22 in an integrated RC filter according to the invention, comprising n diode connected input transistors T1-Tn having emitters being coupled through mutually corresponding emitter resistances Re1-Ren to the supply voltage Vcc, bases and collectors being jointly connected to a current input, be connected to the collector of one of the transistors of the differential amplifier 20 (see FIG. 10), as well as comprising an output transistor T, an emitter thereof being coupled to supply voltage Vcc through an emitter resistance Re substantially equal to the each of the emitter resistances Re1-Ren of said n diode connected input transistors T1-Tn, a base thereof being coupled to the bases of said n diode connected input transistors T1-Tn and a collector thereof providing an output current Iout. The output current Iout is defined by 1/n* Iin, in which Iin is the input current of the current mirror supplied to said current input from the collector of said one of the transistors of the differential amplifier 20.

The scope of the invention is not limited to the embodiments explicitly disclosed. The invention is embodied in each new characteristic and each combination of characteristics. Any reference signs do not limit the scope of the claims. The word "comprising" does not exclude the presence of other elements or steps than those listed in a claim. Use of the word "a" or "an" preceding an element does not exclude the presence of a plurality of such elements.

The invention claimed is:

1. An integrated RC filter comprising:
a first capacitor,
a first resistor that is coupled to the first capacitor through a first node, a signal input of the integrated RC filter being coupled through one of the first resistor and the first capacitor to the first node,
an amplifier that is coupled between the signal input and the one of the first resistor and the first capacitor, having a gain factor substantially larger than unity, and
an attenuator that couples the first node to a signal output, the attenuator having an attenuation factor that substantially corresponds to the gain factor, wherein:
the signal input is subsequently coupled through the amplifier and the first capacitor to the first node,
the first node is coupled through the first resistor to a DC reference voltage, and through the attenuator to the signal output,
the amplifier is arranged to provide an output signal having an average DC output level at substantially half of a supply voltage level,
the attenuator includes a buffer stage followed by a resistive voltage divider,
the buffer stage includes an n-MOS transistor stage and
the DC reference voltage is substantially equal to half of a difference between the supply voltage level and a threshold voltage of the n-MOS transistor stage.

2. An integrated RC filter comprising:
a first capacitor,
a first resistor that is coupled to the first capacitor through a first node, a signal input of the integrated RC filter being coupled through one of the first resistor and the first capacitor to the first node,
an amplifier that is coupled between the signal input and the one of the first resistor and the first capacitor, having a gain factor substantially larger than unity, and
an attenuator that couples the first node to a signal output, the attenuator having an attenuation factor that substantially corresponds to the gain factor, wherein:
the signal input is subsequently coupled through the amplifier and the first capacitor to the first node,
the first node is coupled through the first resistor to a DC reference voltage, and through the attenuator to the signal output, the amplifier is arranged to provide an output signal having an average DC output level at substantially half of a supply voltage level, the attenuator includes a buffer stage followed by a resistive voltage divider, the buffer stage includes a p-MOS transistor stage and the DC reference voltage is substantially equal to half of a difference between ground and a threshold voltage of the p-MOS transistor stage.

3. An integrated RC filter comprising:

a first capacitor, a first resistor that is coupled to the first capacitor through a first node, a signal input of the integrated RC filter being coupled through one of the first resistor and the first capacitor to the first node, an amplifier that is coupled between the signal input and the one of the first resistor and the first capacitor, having a gain factor substantially larger than unity, and an attenuator that couples the first node to a signal output, the attenuator having an attenuation factor that substantially corresponds to the gain factor, wherein:

the signal input is coupled through the amplifier and the first resistor to the first node, the first node is coupled through the first capacitor to a DC reference voltage and through the attenuator to the signal output, the attenuator includes a buffer stage followed by a resistive voltage divider, the buffer stage includes an n-MOS transistor stage, and the amplifier is arranged to provide an output signal having an average DC output level at substantially half of a difference between a supply voltage and a threshold voltage of the n-MOS transistor stage.

4. An integrated RC filter comprising:

a first capacitor, a first resistor that is coupled to the first capacitor through a first node, a signal input of the integrated RC filter being coupled through one of the first resistor and the first capacitor to the first node, an amplifier that is coupled between the signal input and the one of the first resistor and the first capacitor, having a gain factor substantially larger than unity, and an attenuator that couples the first node to a signal output, the attenuator having an attenuation factor that substantially corresponds to the gain factor, wherein:

the signal input is coupled through the amplifier and the first resistor to the first node, the first node is coupled through the first capacitor to a DC reference voltage and through the attenuator to the signal output, the attenuator includes a buffer stage followed by a resistive voltage divider, the buffer stage includes a p-MOS transistor stage, and the amplifier is arranged to provide an output signal having an average DC output level at substantially half of a difference between ground and a threshold voltage of the p-MOS transistor stage.

5. An integrated RC filter comprising:

a first capacitor, a first resistor that is coupled to the first capacitor through a first node, a signal input of the integrated RC filter being coupled through one of the first resistor and the first capacitor to the first node, an amplifier that is coupled between the signal input and the one of the first resistor and the first capacitor, having a gain factor substantially larger than unity, and an attenuator that couples the first node to a signal output, the attenuator having an attenuation factor that substantially corresponds to the gain factor, wherein:

the signal input comprises low pass and high pass signal inputs, and the amplifier comprises first and second amplifiers, respectively coupled between the low pass and high pass signal inputs and the first resistor and the first capacitor.

6. An integrated RC filter comprising:

a first capacitor, a first resistor that is coupled to the first capacitor through a first node, a signal input of the integrated RC filter being coupled through one of the first resistor and the first capacitor to the first node, an amplifier that is coupled between the signal input and the one of the first resistor and the first capacitor, having a gain factor substantially larger than unity, and an attenuator that couples the first node to a signal output, the attenuator having an attenuation factor that substantially corresponds to the gain factor, wherein:

the signal input is coupled through the amplifier and the first resistor to the first node, the first node is coupled through the first capacitor to a DC reference voltage and through the attenuator to the signal output, the signal input is coupled through a signal subtracting device, the amplifier, and the first resistor to the first node, the first node is coupled through the first capacitor to a DC reference voltage and through the attenuator to the signal output, and an output of the attenuator is coupled to an input of the signal subtracting device via a negative DC feedback loop.

7. An integrated RC filter comprising:

a first capacitor, a first resistor that is coupled to the first capacitor through a first node, a signal input of the integrated RC filter being coupled through one of the first resistor and the first capacitor to the first node, an amplifier that is coupled between the signal input and the one of the first resistor and the first capacitor, having a gain factor substantially larger than unity, and an attenuator that couples the first node to a signal output, the attenuator having an attenuation factor that substantially corresponds to the gain factor, wherein:

the signal input is subsequently coupled through the amplifier and the first capacitor to the first node, the first node is coupled through the first resistor to a DC reference voltage, and through the attenuator to the signal output, the signal input includes a differential pair of input terminals and the signal output includes a differential pair of output terminals, the amplifier includes a differential amplifier having a differential amplifier input constituting the differential pair of input terminals, and the attenuator includes a differential attenuator having a differential output constituting the differential pair of output terminals of the integrated RC filter, the differential amplifier having a differential amplifier output that includes a first amplifier output terminal and a second amplifier output terminal, the first amplifier output terminal is coupled through the first capacitor to the first node, the second amplifier output terminal is coupled through a second capacitor to a second node, the first and second nodes are coupled through the first and a second resistor, respectively, to the DC reference voltage, and to first and second terminals of a differential input of the differential attenuator.

8. The integrated RC filter as claimed in claim 7, wherein:

the amplifier includes first and second transconductance amplifiers having mutually crossconnected differential inputs coupled to the differential pair of input terminals of the signal input, each of the first and second transconductance amplifiers includes a single current output, the single current outputs of the first and second single transconductance amplifiers providing mutually phase opposite output signals to the first and second resistors respectively and being coupled to outputs of first and second mutually identical DC voltage dividers.

9. The integrated RC filter as claimed in claim 7, wherein:

the attenuator includes a first and a second buffer stage, each of the first and second buffer stages includes an input constituting respectively the first and second input terminals of the differential input of the attenuator, each of the first and second buffer stages includes one of: an emitter follower transistor stage and a source follower transistor stage, the first and second buffer stages include first and second output terminals that are mutually coupled through a serial arrangement of first, second, and third resistance means, the first resistance means is substantially identical to the third resistance means, and first and second terminals of the differential output of the attenuator are coupled across the second resistance means.

10. The integrated RC filter as claimed in claim 7, wherein:

the attenuator includes the first and a second buffer stage, each of the first and second buffer stages having an input constituting respectively the first and second input terminals of the differential input of the attenuator, each of the first and second buffer stages includes one of: an emitter follower transistor stage and a source follower transistor stage, the first and second buffer stages having first and second output terminals coupled to a pair of input terminals of a differential stage, outputs of the differential stage are mutually coupled through a serial arrangement of two mutually equal resistors, and a common node of the resistors is supplied with a voltage corresponding to an average DC level of the input signal of the RC filter.

11. The integrated RC filter as claimed in claim 8, wherein the first and second transconductance amplifiers each includes a differential amplifier stage for converting a differential pair of input voltages to a differential pair of output currents, the differential pair of output currents are supplied to first and second current mirrors, output current of the first current mirror is supplied to an input of a third current mirror, and output currents of the second and third current mirrors are supplied to an output of each transconductance amplifier.

12. The integrated RC filter as claimed in claim 11, wherein the output currents of the first and second current mirrors are smaller than the output currents of the differential amplifier stage.

13. The integrated RC filter as claimed in claim 12, wherein the differential amplifier stage includes a differential pair of transistors, collectors thereof carrying the differential pair of output currents, the first and second current mirrors each includes:
　a multiple number of diode connected input transistors having:
　　emitters that are coupled through mutually corresponding emitter resistances to a bias voltage, and
　　bases and collectors that are jointly connected to the respective collectors of the differential pair of transistors,
　an output transistor having:
　　an emitter that is coupled to the bias voltage through an emitter resistance substantially equal to the emitter resistances of each of the multiple number of diode connected input transistors,
　　a base that is coupled to the bases of the diode connected input transistors, and
　　a collector that provides the output signal.

14. The integrated RC filter as claimed in claim 11, wherein the third current mirror comprises first, second, and third transistors, the first and second transistors having:
　mutually coupled base electrodes and
　emitter electrodes commonly connected via respectively first and second emitter resistors, the first transistor is provided with the output current of the first current mirror, the second transistor provides a collector output current of the third current mirror that is substantially equal to the output current of the first current mirror, and the third transistor has:
　a collector electrode coupled to a bias voltage and
　base and emitter electrodes respectively coupled to the collector and base electrodes of the first transistor.

15. The integrated RC filter as claimed in claim 14, wherein a fourth transistor is cascode connected to the second transistor and has:
　a base coupled to the base of the third transistor, and
　a collector and emitter respectively coupled to the bias voltage and the collector of the second transistor.

16. The integrated RC filter as claimed in claim 13, wherein the third current mirror comprises first, second, and third transistors, the first and second transistors having:
　mutually coupled base electrodes and
　emitter electrodes massconnected via respectively first and second emitter resistors, the first transistor is provided with the output current of the first current mirror, the second transistor provides a collector output current of the third current mirror that is substantially equal to the output current of the first current mirror, and the third transistor has:
　a collector electrode coupled to a bias voltage and
　base and emitter electrodes respectively coupled to the collector and base electrodes of the first transistor.

17. The integrated RC filter as claimed in claim 16, wherein a fourth transistor is cascode connected to the second transistor and has:

a base coupled to the base of the third transistor, and a collector and emitter respectively coupled to the bias voltage and the collector of the second transistor.

18. An integrated RC filter comprising:

a first capacitor, a first resistor that is coupled to the first capacitor through a first node, a signal input of the integrated RC filter being coupled through one of the first resistor and the first capacitor to the first node, an amplifier that is coupled between the signal input and the one of the first resistor and the first capacitor, having a gain factor substantially larger than unity, and an attenuator that couples the first node to a signal output, the attenuator having an attenuation factor that substantially corresponds to the am factor, wherein:

the signal input is coupled through the amplifier and the first resistor to the first node, the first node is coupled through the first capacitor to a DC reference voltage and through the attenuator to the signal output, the signal input includes a differential pair of input terminals, the signal output includes a differential pair of output terminals, the amplifier includes a differential amplifier having a differential amplifier input constituting the differential pair of input terminals, and the attenuator includes a differential attenuator having a differential output constituting the differential pair of output terminals of the integrated RC filter, the differential amplifier having a differential amplifier output that includes a first amplifier output terminal and a second amplifier output terminal, the first amplifier output terminal is coupled through the first resistor to the first node, the second amplifier output terminal is coupled through a second resistor to a second node, and the first and second nodes are respectively coupled to first and second terminals of a differential input of the differential attenuator and mutually coupled through a further capacitor having a capacitance value of half the capacitance value of the first capacitor.

19. The integrated RC filter as claimed in claim 18, wherein:

the amplifier includes first and second transconductance amplifiers having mutually crossconnected differential inputs coupled to a differential pair of input terminals of the signal input, each of the first and second transconductance amplifiers includes a single current output, the single current outputs of the first and second single transconductance amplifiers providing mutually phase opposite output signals to the first and second resistors respectively and being coupled to outputs of first and second mutually identical DC voltage dividers.

20. The integrated RC filter as claimed in claim 18, wherein:

the attenuator includes the first and a second buffer stage, each of the first and second buffer stages includes an input constituting respectively the first and second input terminals of the differential input of the attenuator, each of the first and second buffer stages includes one of: an emitter follower transistor stage and a source follower transistor stage, the first and second buffer stages include first and second output terminals that are mutually coupled through a serial arrangement of first, second, and third resistance means, the first resistance means is substantially identical to the third resistance means, and first and second terminals of the differential output of the attenuator are coupled across the second resistance means.

21. The integrated RC filter as claimed in claim 18, wherein:

the attenuator includes the first and a second buffer stage, each of the first and second buffer stages having an input constituting respectively the first and second input terminals of the differential input of the attenuator, each of the first and second buffer stages includes one of: an emitter follower transistor stage and a source follower transistor stage, the first and second buffer stages having first and second output terminals coupled to a pair of input terminals of a differential stage, outputs of the differential stage are mutually coupled through a serial arrangement of two mutually equal resistors, and the common node of the resistors is supplied with a DC reference voltage corresponding to the average DC level of the input signal of the RC filter.

22. The integrated RC filter as claimed in claim 19, wherein the first and second transconductance amplifiers each includes a differential amplifier stage for converting a differential pair of input voltages to a differential pair of output currents, the differential pair of output currents are supplied to first and second current mirrors, output current of the first current mirror is supplied to an input of a third current mirror, and output currents of the second and third current mirrors are supplied to an output of each transconductance amplifier.

23. The integrated RC filter as claimed in claim 22, wherein the output currents of the first and second current mirrors are smaller than the output currents of the differential amplifier stage.

24. The integrated RC filter as claimed in claim 23, wherein the differential amplifier stage includes a differential pair of transistors, collectors thereof carrying the differential pair of output currents, the first and second current mirrors each includes:

a multiple number of diode connected input transistors having:

emitters that are coupled through mutually corresponding emitter resistances to a bias voltage, and bases and collectors that are jointly connected to the respective collectors of the differential pair of transistors, an output transistor having:

an emitter that is coupled to the bias voltage through an emitter resistance substantially equal to the emitter resistances of each of the multiple number of diode connected input transistors, a base that is coupled to the bases of the diode connected input transistors, and a collector that provides the output signal.

25. The integrated RC filter as claimed in claim 22, wherein the third current mirror comprises first, second, and third transistors, the first and second transistors having:
   mutually coupled base electrodes and
   emitter electrodes massconnected via respectively first and second emitter resistors,
the first transistor is provided with the output current of the first current mirror,
the second transistor provides a collector output current of the third current mirror that is substantially equal to the output current of the first current mirror, and
the third transistor has:
   a collector electrode coupled to a bias voltage and
   base and emitter electrodes respectively coupled to the collector and base electrodes of the first transistor.

26. The integrated RC filter as claimed in claim 25, wherein a fourth transistor is cascode connected to the second transistor and has:
   a base coupled to the base of the third transistor, and
   a collector and emitter respectively coupled to the bias voltage and the collector of the second transistor.

27. The integrated RC filter as claimed in claim 24, wherein the third current mirror comprises first, second, and third transistors,
the first and second transistors having:
   mutually coupled base electrodes and
   emitter electrodes massconnected via respectively first and second emitter resistors,
the first transistor is provided with the output current of the first current mirror,
the second transistor provides a collector output current of the third current mirror that is substantially equal to the output current of the first current mirror, and
the third transistor has:
   a collector electrode coupled to a bias voltage and
   base and emitter electrodes respectively coupled to the collector and base electrodes of the first transistor.

28. The integrated RC filter as claimed in claim 27, wherein a fourth transistor is cascode connected to the second transistor and has:
   a base coupled to the base of the third transistor, and
   a collector and emitter respectively coupled to the bias voltage and the collector of the second transistor.

* * * * *